United States Patent
Ji et al.

(10) Patent No.: US 12,281,379 B2
(45) Date of Patent: Apr. 22, 2025

(54) PREPARATION METHOD OF NIOBIUM DISELENIDE FILM WITH ULTRA-LOW FRICTION AND LOW ELECTRICAL NOISE UNDER SLIDING ELECTRICAL CONTACT IN VACUUM

(71) Applicant: LANZHOU INSTITUTE OF CHEMICAL PHYSICS CAS, Gansu (CN)

(72) Inventors: Li Ji, Gansu (CN); Xiaohong Liu, Gansu (CN); Yang Yang, Gansu (CN); Hongxuan Li, Gansu (CN); Huidi Zhou, Gansu (CN); Jianmin Chen, Gansu (CN)

(73) Assignee: LANZHOU INSTITUTE OF CHEMICAL PHYSICS CAS, Lanzhou (CN)

(*) Notice: Subject to any disclaimer, the term of this patent is extended or adjusted under 35 U.S.C. 154(b) by 123 days.

(21) Appl. No.: 18/067,485

(22) Filed: Dec. 16, 2022

(65) Prior Publication Data
US 2023/0227963 A1    Jul. 20, 2023

(30) Foreign Application Priority Data
Jan. 19, 2022    (CN) .......................... 202210058690.0

(51) Int. Cl.
*C23C 14/06*    (2006.01)
*C23C 14/02*    (2006.01)
(Continued)

(52) U.S. Cl.
CPC ........ *C23C 14/0623* (2013.01); *C23C 14/022* (2013.01); *C23C 14/025* (2013.01);
(Continued)

(58) Field of Classification Search
CPC . C23C 14/0623; C23C 14/022; C23C 14/025; C23C 14/3407; C23C 14/345; C23C 14/35; C23C 14/352; H01J 37/3426
See application file for complete search history.

(56) References Cited

U.S. PATENT DOCUMENTS 9,115,426 B2 *   8/2015   Kolev ................ C23C 16/0272

FOREIGN PATENT DOCUMENTS

| CN | 108517499 A | 9/2018 |
| CN | 113560152 A | 10/2021 |

OTHER PUBLICATIONS

Machine Translation CN108517499 (Year: 2018).*
(Continued)

*Primary Examiner* — Michael A Band
(74) *Attorney, Agent, or Firm* — MH2 Technology Law Group, LLP

(57) ABSTRACT

The present disclosure relates to a preparation method of a niobium diselenide ($NbSe_2$) film with ultra-low friction and low electrical noise under sliding electrical contact in vacuum. The method uses a direct current (DC) closed field magnetron sputtering method for preparation. Through process design of low deposition pressure and low sputtering energy, on one hand, a purity of an $NbSe_2$ sputtered product is kept, generation of interference phases such as $NbSe_3$ is avoided, and electrical conductivity of the sputtered $NbSe_2$ film is greatly improved, and on the other hand, a nanocrystalline/amorphous superlattice composite structure is formed, and excellent mechanical and lubricating properties are achieved. Under sliding electrical contact in vacuum, compared with those of a common electroplated gold coating, a friction coefficient of the film is reduced to 0.02 from 0.25, a wear life is prolonged by at least 7 times, and the electrical noise is reduced by about 50%.

5 Claims, 4 Drawing Sheets

(51) Int. Cl.
*C23C 14/34* (2006.01)
*C23C 14/35* (2006.01)
*H01J 37/34* (2006.01)
*C23C 14/50* (2006.01)

(52) U.S. Cl.
CPC ............ *C23C 14/345* (2013.01); *C23C 14/35* (2013.01); *C23C 14/352* (2013.01); *H01J 37/3426* (2013.01); *C23C 14/505* (2013.01)

(56) References Cited

OTHER PUBLICATIONS

First Office Action issued in Chinese Patent Application No. 202210058690.0 on Jul. 29, 2022, 5 pages.
Liu et al., "Tailoring the lubricative and electroconductive bifunction properties of NbSe2 film by controlling the sputtering plasma," Applied Surface Science, 455, (2018), pp. 1161-1170.

* cited by examiner

PREPARATION METHOD OF NIOBIUM DISELENIDE FILM WITH ULTRA-LOW FRICTION AND LOW ELECTRICAL NOISE UNDER SLIDING ELECTRICAL CONTACT IN VACUUM

CROSS REFERENCE TO RELATED APPLICATIONS

This patent application claims the benefit and priority of Chinese Patent Application No. 202210058690.0, filed with the China National Intellectual Property Administration on Jan. 19, 2022, the disclosure of which is incorporated by reference herein in its entirety as part of the present application.

TECHNICAL FIELD

The present disclosure relates to a preparation method of a niobium diselenide lubricating film, and in particular, to a preparation method of a niobium diselenide ($NbSe_2$) film with ultra-low friction and low electrical noise under sliding electrical contact in vacuum, belonging to the technical field of lubricating materials.

BACKGROUND

Sliding electrical contact is a special mechanical design used to transmit electric energy and signals in the sliding contact state, and has been widely used in aerospace applications. For example, electrically conductive slip rings are used to transfer electric energy collected by a solar panel to a spacecraft system. The lubrication and wear resistance of the sliding electrical contact materials directly determine the stability and reliability of the entire system. However, the sliding electrical contact condition causes very serious damage to the lubricating materials, which is restricted by mechanical factors, as well as the influence of a thermal effect of the electric current. In addition, there is serious arc erosion damage, which greatly limits the selection and use of lubricating materials. Especially for the aerospace field, the use in vacuum environment is also involved. At present, precious metals such as gold and platinum are mainly used. However, the precious metal friction pairs exhibit serious adhesion wear and a high friction coefficient (usually no less than 0.3) when carrying current, which seriously limits the wear life.

The niobium diselenide ($NbSe_2$) material has a layered easy-to-shear structure similar to $MoS_2$, which has excellent lubricating properties. In addition, due to the specificity of its electronic structure, the niobium diselenide exhibits electrical conductivity as metal level. As a new lubricating material used under sliding electrical contact in vacuum, the niobium diselenide has great potential. However, developing a surface treatment technology to prepare $NbSe_2$ that can withstand the harsh conditions of coupling vacuum and current-carrying is the key difficulty. CN202110844056.5 discloses a method for solid bonded lubricating coating of $NbSe_2$ by spraying. Under current-carrying friction conditions in vacuum, the friction coefficient can be stabilized at about 0.05, which has shown a significant improvement effect compared with the electroplated gold coating. However, the service life is not improved remarkably. At present, the service life is about 22,000 cycles, which is still far from the expected service life in the future. Applied Surface Science 455, 2018, 1161 and CN201810261644.4 disclose the preparation of an $NbSe_2$ film using the radio-frequency (RF) magnetron sputtering method, which shows the dual-functional characteristics of lubrication and electrical conductivity under atmospheric non current-carrying conditions. However, there are some interfering substances in the prepared films, such as $NbSe_3$, which adversely affects the lubrication and electrical conductivity. If the resistivity can only reach $1\times10^{-3}$ $\Omega\cdot cm$, it is still three orders of magnitude less than that of the current electroplated gold coating (with a resistivity of $2.4\times10^{-6}$ $\Omega\cdot cm$). It cannot withstand the harsh conditions of special vacuum current-carrying electrical contact in space while meeting the high requirements for low friction, long life, high electrical conductance, and low electrical noise.

SUMMARY

An objective of the present disclosure is to provide a preparation method of an $NbSe_2$ lubricating film with ultra-low friction and low electrical noise under sliding electrical contact in vacuum.

I. Preparation of $NbSe_2$ Lubricating Film

For the preparation of the $NbSe_2$ lubricating film with ultra-low friction and low electrical noise under sliding electrical contact in vacuum, the preparation method uses the direct current (DC) closed field magnetron sputtering method, and ensures the purity and crystal structure of the $NbSe_2$ sputtered film through the process design of low deposition pressure and low sputtering energy, which endows it with excellent vacuum current-carrying tribological properties. The preparing process is completed on a DC closed field magnetron sputtering deposition system with four target sites. Two targets are equipped with titanium (Ti) targets and connected with a DC sputtering power supply for excitation. The other two targets are equipped with $NbSe_2$ targets and also connected with a DC sputtering power supply for excitation. The sample rack is connected with a pulse negative bias power supply (20 to 60 KHz) to apply a negative voltage. The schematic structural diagram is shown in FIG. 1. A specific process is as follows.

(1) A to-be-coated substrate with a clean surface is placed on a sample holder in a coating chamber, and argon plasma cleaning and etching are conducted to remove residual impurities and pollutants on the surface of the substrate. The to-be-coated substrate is made of copper, aluminum, titanium alloy, or steel. An argon plasma cleaning and etching process is as follows: a background vacuum pressure of a vacuum cavity of the coating chamber is lower than $3\times10^{-3}$ Pa. A cleaning pressure is stabilized at 0.8 to 2.0 Pa. The cleaning is conducted at a negative substrate bias voltage of −400 to −800 V.

(2) A titanium transition layer is prepared on the surface of the substrate by taking argon as a sputtering gas and a titanium target as a sputtering target to improve film-substrate bonding strength between the substrate and the $NbSe_2$ film. A purity of the Ti target is higher than 99.8%. The titanium transition layer is prepared at a sputtering pressure of 0.1 to 0.5 Pa, a target sputtering power of 0.5 to 10 $W/cm^2$, and a negative substrate bias voltage of −50 to −400 V. The Ti layer has a thickness of 0.1 to 1 um.

(3) An $NbSe_2$ lubricating layer is prepared by taking argon as a sputtering gas and an $NbSe_2$ target as a sputtering target. A purity of the $NbSe_2$ target is higher than 99.9%. The lubricating layer is prepared at a sputtering pressure of 0.04 to 0.3 Pa, a target sputtering power of 0.2 to 1 $W/cm^2$, and a negative substrate bias voltage of −50 to −400 V. The NbSe$_2$ layer has a thickness of 1 to 5 um.

FIG. 2 shows an X-ray diffraction (XRD) pattern of an NbSe$_2$ lubricating film prepared by the present disclosure. It can be seen from FIG. 2 that only a diffraction peak of an NbSe$_2$ crystal phase is displayed, and there is no common interference phase such as NbSe$_3$ that is unfavorable to lubrication and electrical conductivity.

FIG. 3 shows a high-resolution transmission electron microscope (HRTEM) photograph of the NbSe$_2$ lubricating film prepared by the present disclosure. It can be seen from FIG. 3 that the NbSe$_2$ lubricating film has a nanocrystalline/amorphous superlattice composite structure, which can effectively prevent the migration of dislocations, and can also release internal stress through the grain boundary sliding mechanism, thus having excellent mechanical and lubricating properties.

II. Properties of NbSe$_2$ Lubricating Film

1. Static Resistivity
   Test method: four probe method.
   Test results: a static resistivity of the NbSe$_2$ lubricating film of the present disclosure can reach $7.8 \times 10^{-6}$ Ω·cm, which is at the same level of magnitude as the resistivity of the current electroplated gold coating ($2.4 \times 10^{-6}$ Ω·cm).
2. Vacuum Current-carrying Tribological Properties
   Test method: a vacuum current-carrying friction and wear test machine is used, a vacuum degree is $1.0 \times 10^{-5}$ mbar, a ball-disc contact linear reciprocating motion mode is used, an upper sample is a GCr15 commercial steel ball with a diameter of 6 mm, a lower sample is a flat copper test piece plated with an NbSe$_2$ lubricating film, a normal load is 1 N, an applied current is 1.0 A, a reciprocating sliding amplitude is 5 mm, and a frequency is 5 Hz.
   Test results: the NbSe$_2$ lubricating film of the present disclosure has a great improvement in the vacuum current-carrying tribological properties compared with the current electroplated gold coating. FIG. 4 shows a comparison of vacuum current-carrying tribological properties between the NbSe$_2$ lubricating film prepared by the present disclosure and a current electroplated gold coating: (a) shows a friction curve; (b) shows a contact voltage; and (c) shows contact electrical noise. It can be seen that a friction coefficient of the NbSe$_2$ lubricating film of the present disclosure is reduced to 0.02 from 0.25, a wear life is prolonged by at least 7 times and reaches at least 100,000 cycles, the contact voltage and electroplating gold are at the same level of magnitude, and the electrical noise is reduced by about 50%.

To sum up, the NbSe$_2$ block pressed by the vacuum isostatic pressing method is used as the sputtering target, and the argon is used as the ionization sputtering gas. With the advantage of high ionization rate in the closed field, sputtering can be conducted at a deposition pressure one order lower than that of conventional sputtering. Combined with the low sputtering energy of DC sputtering, the damage to the NbSe$_2$ sputtered products during the sputtering is greatly reduced, generation of interference phases such as NbSe$_3$ is avoided, and electrical conductivity of the sputtered NbSe$_2$ film is greatly improved. In addition, a nanocrystalline/amorphous superlattice composite structure is formed, which can effectively prevent the migration of dislocations, and can also release internal stress through the grain boundary sliding mechanism, thus having excellent mechanical and lubricating properties. Finally, the film can withstand the harsh conditions of vacuum current-carrying coupling, showing the comprehensive performance advantages of ultra-low friction coefficient, long life, and low electrical noise, and can be widely applied to surface lubrication treatment of sliding electrical contact moving parts such as electrically conductive slip rings, slip barrels, and antennas in aerospace and aviation fields.

DETAILED DESCRIPTION OF THE EMBODIMENTS

Example 1

Figure 1:
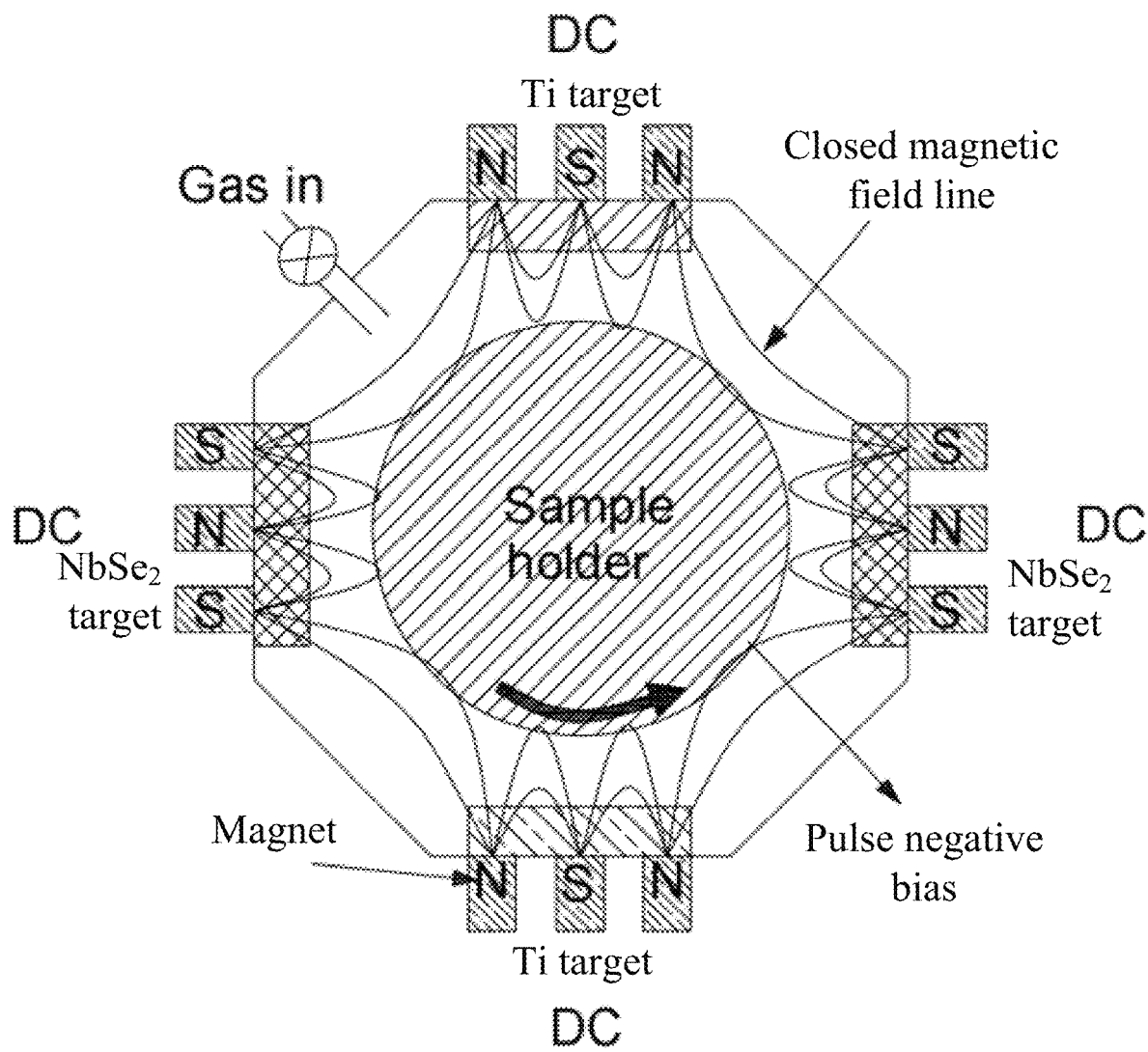
FIG. 1 is a schematic diagram of a DC closed field magnetron sputtering deposition system for an NbSe$_2$ lubricating film.
Figure 2:
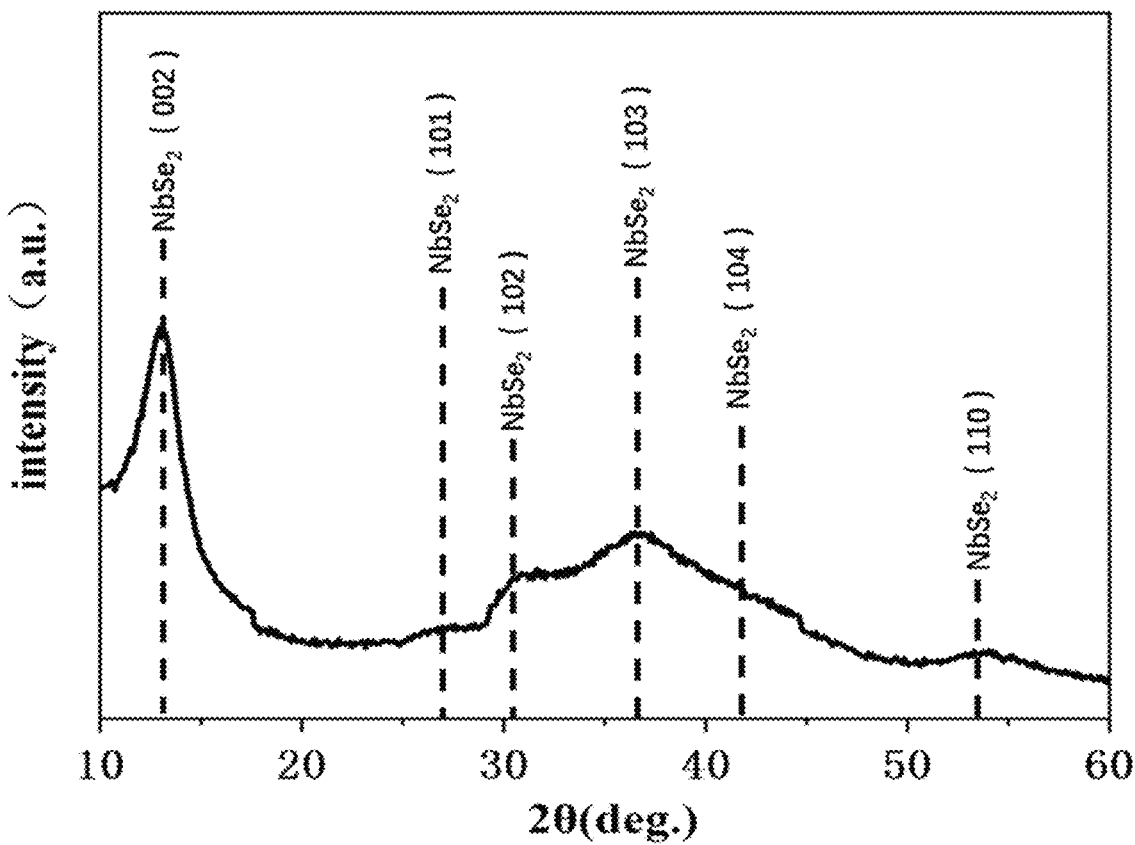
FIG. 2 shows an XRD pattern of the NbSe$_2$ lubricating film prepared by the present disclosure.
Figure 3:
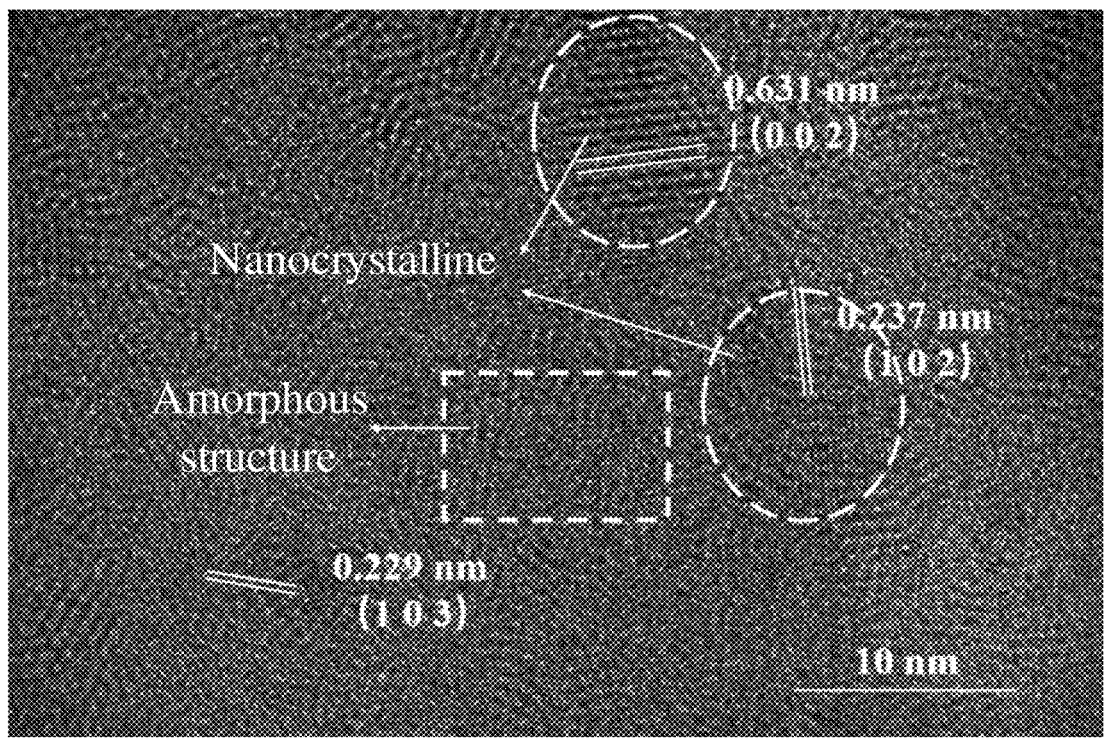
FIG. 3 shows a HRTEM photograph of the NbSe$_2$ lubricating film prepared by the present disclosure.
Figure 4A:
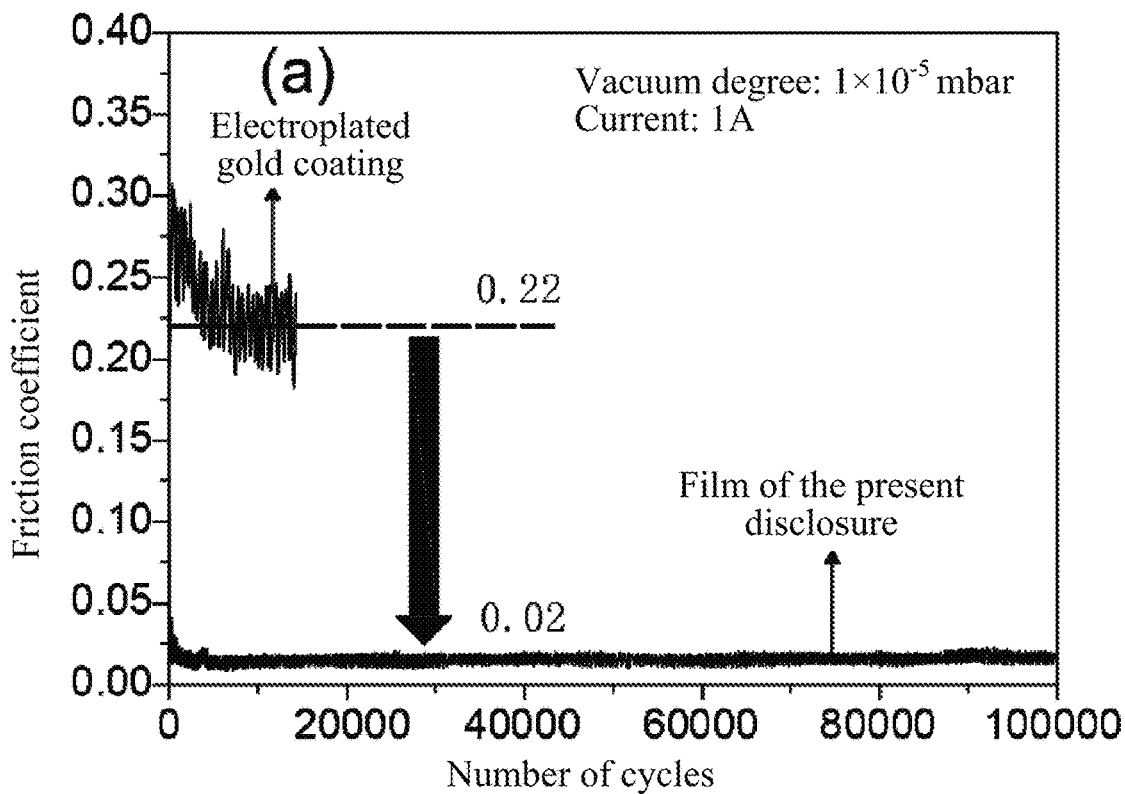
FIG. 4A shows a friction curve comparison between the NbSe$_2$ lubricating film prepared by the present disclosure and a current electroplated gold coating.
Figure 4B:
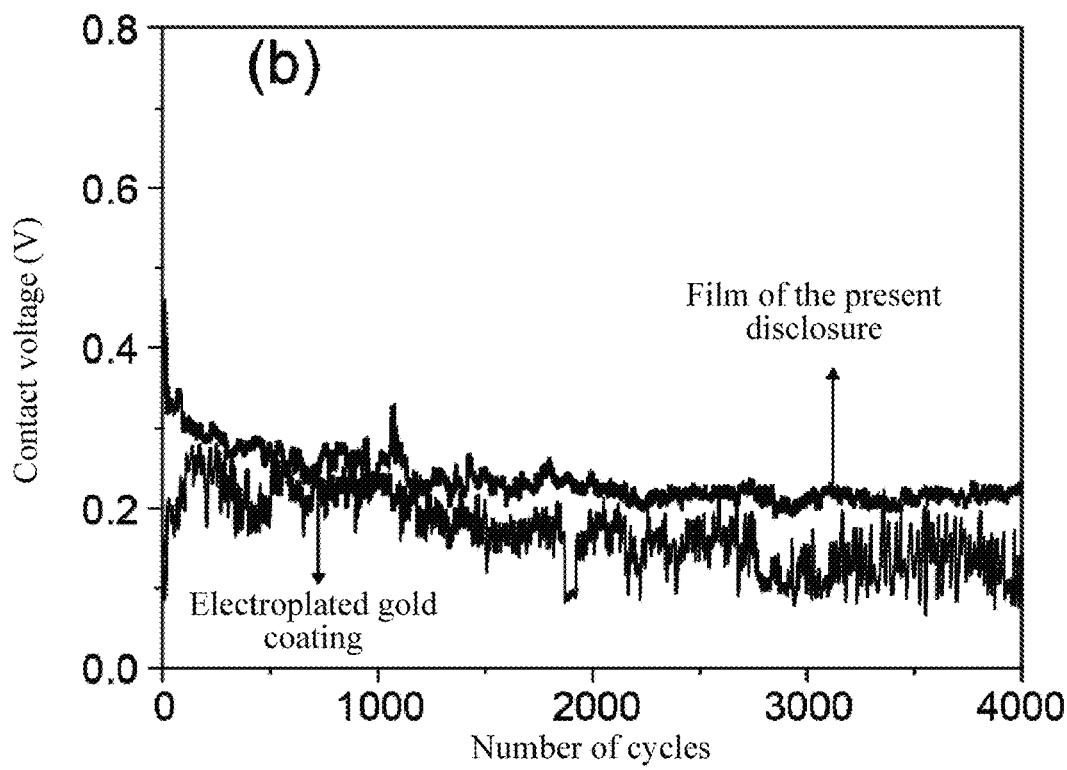
FIG. 4B shows a contact voltage comparison between the NbSe$_2$ lubricating film prepared by the present disclosure and a current electroplated gold coating.
Figure 4C:
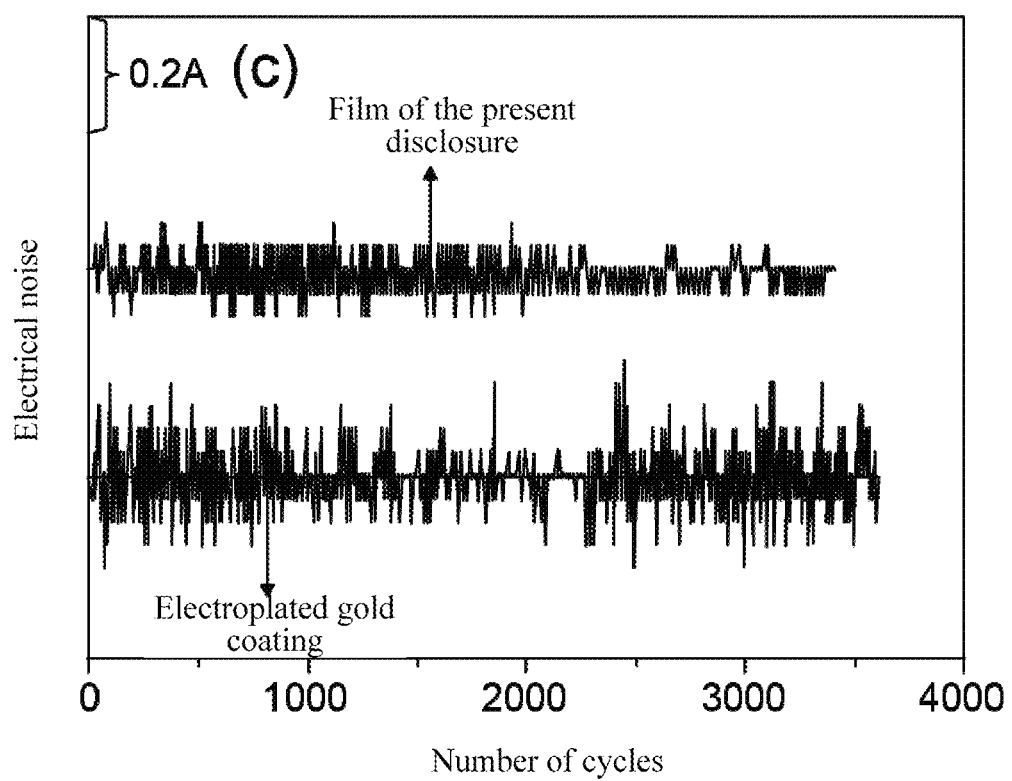
FIG. 4C shows a contact electrical noise comparison between the NbSe$_2$ lubricating film prepared by the present disclosure and a current electroplated gold coating.

1) Argon plasma cleaning of to-be-coated sample: a copper slip ring with a clean surface and copper, aluminum, 9Cr18, and TC4 test blocks were placed on a sample holder in a coating chamber, and an air pressure in the vacuum cavity was pumped to be no more than $3.0 \times 10^{-3}$ Pa. High-purity argon was introduced till a pressure of 1.8 Pa. A negative bias power supply was turned on. A voltage was adjusted −600 V. Argon plasma bombardment cleaning was conducted for 20 min to remove residual impurities and pollutants on the surface of the substrate.

2) Deposition of titanium (Ti) transition layer: an argon flow was adjusted to maintain the pressure in the chamber at 0.1 Pa. A DC sputtering power supply for a titanium target and a negative bias power supply were turned on. A sputtering power density of the titanium target was adjusted to 0.3 W/cm$^2$. A negative bias voltage was −50 V. Deposition was conducted with a thickness of 0.2 μm.

3) Deposition of NbSe$_2$ conductive lubricating layer: the argon flow was adjusted to maintain the pressure in the chamber at 0.05 Pa. The DC sputtering power supply for the titanium target was turned off. A DC sputtering power supply for the NbSe$_2$ target was turned on. An NbSe$_2$ target sputtering power was adjusted to 0.3 W/cm$^2$. A negative bias voltage of the negative bias power supply was adjusted to −50 V. After deposition with a thickness of 2 μm, Ar gas was filled in place for natural cooling. When the temperature was stabilized to a room temperature, vacuum was released to take out the sample.

4) Film performance: the film had a static resistivity of $8.6 \times 10^{-6}$ Ω·cm and a friction coefficient of 0.025 under vacuum current-carrying conditions, and a wear life of 100,000 cycles without failure.

Example 2

1) Argon plasma cleaning and etching of to-be-coated sample: a copper slip ring with a clean surface and copper, aluminum, 9Cr18, and TC4 test blocks were placed on a sample holder in a coating chamber, and an air pressure in the vacuum cavity was pumped to be no more than $3.0\times10^{-3}$ Pa. High-purity argon was introduced till a pressure of 0.8 Pa. A negative bias power supply was turned on. A voltage was adjusted −800 V. Argon plasma bombardment cleaning was conducted for 30 min to remove residual impurities and pollutants on the surface of the substrate.

2) Deposition of titanium transition layer: an argon flow was adjusted to maintain the pressure in the chamber at 0.3 Pa. A DC sputtering power supply for a titanium target and a negative bias power supply were turned on. A sputtering power density of the titanium target was adjusted to 1.5 W/cm$^2$. A negative bias voltage was −200 V. Deposition was conducted with a thickness of 0.4 μm.

3) Deposition of NbSe$_2$ conductive lubricating layer: the argon flow was adjusted to maintain the pressure in the chamber at 0.15 Pa. The DC sputtering power supply for the titanium target was turned off. A DC sputtering power supply for the NbSe$_2$ target was turned on. An NbSe$_2$ target sputtering power was adjusted to 0.5 W/cm$^2$. A negative bias voltage of the negative bias power supply was adjusted to −150 V. After deposition with a thickness of 3.5 μm, Ar gas was filled in place for natural cooling. When the temperature was stabilized to a room temperature, vacuum was released to take out the sample.

4) Film performance: the film had a static resistivity of $7.8\times10^{-6}$ Ω·cm and a friction coefficient of 0.022 under vacuum current-carrying conditions, and a wear life of 100,000 cycles without failure.

Example 3

1) Argon plasma cleaning and etching of to-be-coated sample: a copper slip ring with a clean surface and copper, aluminum, 9Cr18, and TC4 test blocks were placed on a sample holder in a coating chamber, and an air pressure in the vacuum cavity was pumped to be no more than $3.0\times10^{-3}$ Pa. High-purity argon was introduced till a pressure of 1.2 Pa. A negative bias power supply was turned on. A voltage was adjusted −400 V. Argon plasma bombardment cleaning was conducted for 40 min to remove residual impurities and pollutants on the surface of the substrate.

2) Deposition of titanium transition layer: an argon flow was adjusted to maintain the pressure in the chamber at 0.5 Pa. A DC sputtering power supply for a titanium target and a negative bias power supply were turned on. A sputtering power density of the titanium target was adjusted to 8.5 W/cm$^2$. A negative bias voltage was −350 V. Deposition was conducted with a thickness of 0.8 μm.

3) Deposition of NbSe$_2$ conductive lubricating layer: the argon flow was adjusted to maintain the pressure in the chamber at 0.3 Pa. The DC sputtering power supply for the titanium target was turned off. A DC sputtering power supply for the NbSe$_2$ target was turned on. An NbSe$_2$ target sputtering power was adjusted to 0.9 W/cm$^2$. A negative bias voltage of the negative bias power supply was adjusted to −350 V. After deposition with a thickness of 4.5 μm, Ar gas was filled in place for natural cooling. When the temperature was stabilized to a room temperature, vacuum was released to take out the sample.

4) Film performance: the film had a static resistivity of $9.2\times10^{-6}$ Ω·cm and a friction coefficient of 0.029 under vacuum current-carrying conditions, and a wear life of 100,000 cycles without failure.

What is claimed is:

1. A preparation method of a niobium diselenide (NbSe$_2$) film with ultra-low friction and low electrical noise under sliding electrical contact in vacuum, wherein the preparation method is conducted by a direct current (DC) closed field magnetron sputtering process; and through process design of low deposition pressure and low sputtering energy, the preparation method comprises the following steps:
    (1) placing a to-be-coated substrate with a clean surface on a sample holder in a coating chamber, and conducting argon plasma cleaning and etching to remove residual impurities and pollutants on a surface of the substrate;
    (2) preparing a titanium (Ti) transition layer on the surface of the substrate by taking argon as a first sputtering gas and a titanium target as a first sputtering target, wherein the Ti transition layer has a thickness of 0.1 to 1 μm; and
    (3) preparing the NbSe$_2$ film on the Ti transition layer by taking argon as a second sputtering gas and an NbSe$_2$ target as a second sputtering target;
    wherein in step (3), the NbSe$_2$ film is prepared at a sputtering pressure of 0.04 to 0.3 Pa, a target sputtering power of 0.5 W/cm$^2$, and a negative substrate bias voltage of −50 to −400 V.

2. The preparation method of an NbSe$_2$ film with ultra-low friction and low electrical noise under sliding electrical contact in vacuum according to claim 1, wherein in step (1), a background vacuum pressure of a vacuum cavity of the coating chamber is lower than $3\times10^{-3}$ Pa; and a cleaning pressure is stabilized at 0.8 to 2.0 Pa, and the cleaning is conducted at a negative substrate bias voltage of −400 to −800 V.

3. The preparation method of an NbSe$_2$ film with ultra-low friction and low electrical noise under sliding electrical contact in vacuum according to claim 1, wherein in step (2), a purity of the Ti target is higher than 99.8%; and the Ti transition layer is prepared at a sputtering pressure of 0.1 to 0.5 Pa, a target sputtering power of 0.5 to 10 W/cm$^2$, and a negative substrate bias voltage of −50 to −400 V.

4. The preparation method of an NbSe$_2$ film with ultra-low friction and low electrical noise under sliding electrical contact in vacuum according to claim 1, wherein in step (3), a purity of the NbSe$_2$ target is higher than 99.9%; and the NbSe$_2$ film has a thickness of 1 to 5 um.

5. The preparation method of an NbSe$_2$ film with ultra-low friction and low electrical noise under sliding electrical contact in vacuum according to claim 1, wherein the to-be-coated substrate is made of copper, aluminum, titanium alloy, or steel.

* * * * *